(12) United States Patent
Cao

(10) Patent No.: US 10,096,759 B2
(45) Date of Patent: Oct. 9, 2018

(54) SEMICONDUCTOR LIGHT SOURCE

(71) Applicant: EPISTAR CORPORATION, Hsinchu (TW)

(72) Inventor: Densen Cao, Sandy, UT (US)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/685,818

(22) Filed: Aug. 24, 2017

(65) Prior Publication Data
US 2017/0352792 A1 Dec. 7, 2017

Related U.S. Application Data

(63) Continuation of application No. 13/867,943, filed on Apr. 22, 2013, now Pat. No. 9,761,775, which is a continuation of application No. 12/785,203, filed on May 21, 2010, now Pat. No. 8,723,212, which is a continuation of application No. 11/397,323, filed on Apr. 4, 2006, now Pat. No. 7,728,345, which is a continuation-in-part of application No. 10/773,123, filed on Feb. 5, 2004, now abandoned, which is a continuation-in-part of application No. 09/939,339, filed on Aug. 24, 2001, now Pat. No. 7,224,001.

(51) Int. Cl.
| | | |
|---|---|---|
| *H01J 1/62* | (2006.01) |
| *H01L 33/64* | (2010.01) |
| *F21K 9/232* | (2016.01) |
| *F21Y 115/10* | (2016.01) |
| *H01L 25/075* | (2006.01) |
| *F21Y 107/30* | (2016.01) |
| *F21V 3/02* | (2006.01) |
| *H01L 33/48* | (2010.01) |
| *H01L 33/62* | (2010.01) |

(52) U.S. Cl.
CPC .............. *H01L 33/64* (2013.01); *F21K 9/232* (2016.08); *F21V 3/02* (2013.01); *F21Y 2107/30* (2016.08); *F21Y 2115/10* (2016.08); *H01L 25/0753* (2013.01); *H01L 33/486* (2013.01); *H01L 33/62* (2013.01); *H01L 2224/45124* (2013.01); *H01L 2224/48091* (2013.01); *H01L 2224/73265* (2013.01); *H01L 2924/01004* (2013.01); *H01L 2924/01078* (2013.01); *H01L 2924/01079* (2013.01); *H01L 2924/12041* (2013.01)

(58) Field of Classification Search
USPC ......................................... 313/498, 506, 512
See application file for complete search history.

(56) References Cited

U.S. PATENT DOCUMENTS

| | | | |
|---|---|---|---|
| 5,806,965 A | 9/1998 | Deese | |
| 2014/0043814 A1* | 2/2014 | Honma | F21V 7/22 362/247 |
| 2014/0218954 A1* | 8/2014 | Yoon | H01L 33/62 362/546 |

* cited by examiner

*Primary Examiner* — Vip Patel
(74) *Attorney, Agent, or Firm* — Ditthavong & Steiner, P.C.

(57) ABSTRACT

A light source may comprise a thermally conductive frame comprising a base and a faceted portion extending from the base. The faceted portion may comprise a plurality of facets spaced circumferentially thereabout. Additionally, a hollow passageway may extend through the base and axially through the faceted portion. A plurality of LED chips may be arranged on the plurality of facets to provide an emission of light in an arc of 360 degrees.

12 Claims, 8 Drawing Sheets

2 or 3 facets 3 or 4 facet 4 facets 5 facets 6 facets 8 facets

SEMICONDUCTOR LIGHT SOURCE

CROSS-REFERENCE TO RELATED APPLICATIONS

This patent application is a continuation of U.S. patent application Ser. No. 13/867,943, filed Apr. 22, 2013, which is a continuation of U.S. patent application Ser. No. 12/785,203, filed May 21, 2010, now U.S. Pat. No. 8,723,212, which is a continuation of U.S. patent application Ser. No. 11/397,323, filed Apr. 4, 2006, now U.S. Pat. No. 7,728,345, which is a continuation-in-part of U.S. patent application Ser. No. 10/773,123, filed on Feb. 5, 2004, now abandoned, which is a continuation-in-part of U.S. patent application Ser. No. 09/939,339, filed on Aug. 24, 2001, now U.S. Pat. No. 7,224,001, the disclosures of each of which are incorporated herein by reference.

TECHNICAL FIELD

The present invention relates to the field of light sources for illuminating physical spaces and, more particularly, to light sources comprising one or more semiconducting light emitting diodes (LEDs).

BACKGROUND

This disclosure pertains to light sources, such as light bulbs, for illuminating physical spaces. In particular, the difficulty of generating sufficient light with a light emitting diode (LED) light source to illuminate a physical space is addressed. In the past, LED lights were often restricted to serving as accent lighting due to insufficient light output.

SUMMARY

A 3-dimensional multiple-faced lead frame is used to create a compact and efficient light source.

DETAILED DESCRIPTION

There are several ways to increase LED output. One is to increase the size of the chips. Another is to utilize more chips in the light source. Increasing chip size creates several issues. First, it increases cost because production processes must be more precise as chip size increases. Second, the chip will have a lower emitting efficiency due to heat issues. When an LED chip is enlarged, heat is also proportionally increased. Large amount of heat are not easily removed from the chip, therefore, the overall temperature of the chip will be increased and light emitting efficiency will decrease.

In the prior art, multiple LED chips were integrated together in 2 dimensional plate form to achieve an increase in power. Integration of multiple chips in a 2 dimensional array also has disadvantages of a large footprint and a complicated production process. This disclosure relates to structures and processes for creating an LED light source using a 3-dimensional multiple facet lead frame to create a compact and efficient light source.

Figure 1:
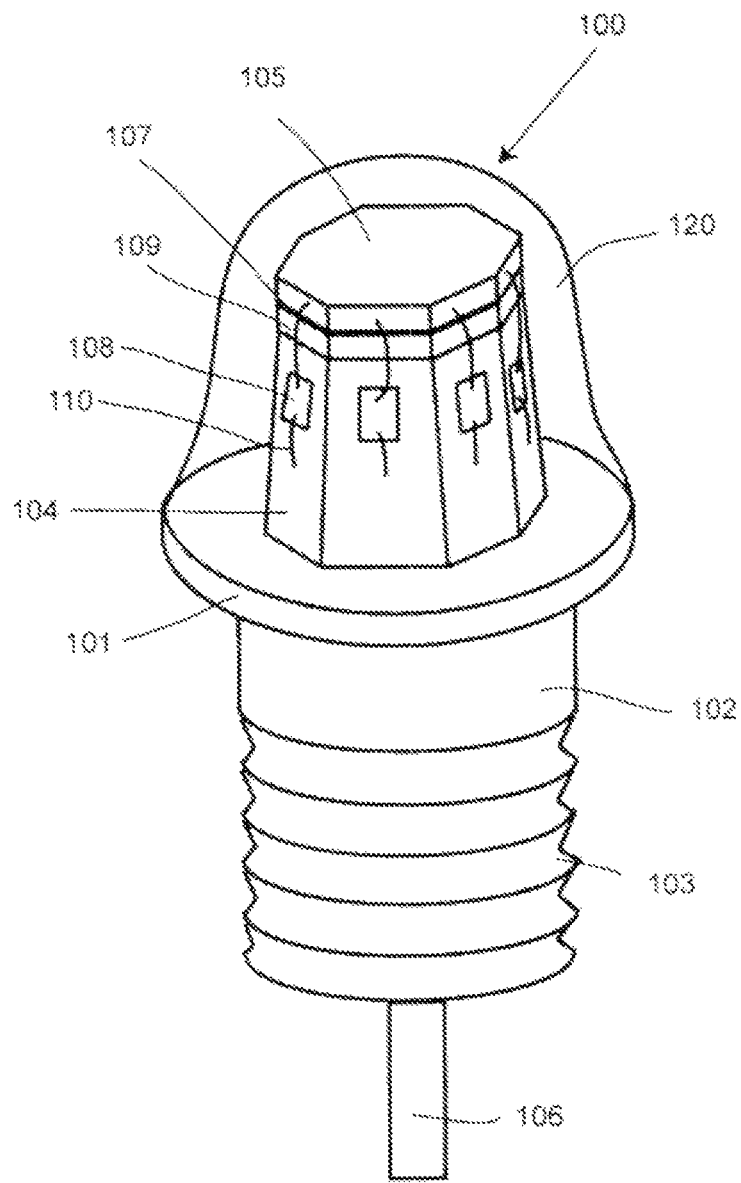
FIG. 1 depicts a perspective view of a light source for illuminating a physical space using a 3-dimensional multiple-faced lead frame.

FIG. 1 depicts an LED light source 100 having a 3-dimensional lead frame with multiple facets or faces to house multiple LED chips. A 3 dimensional lead frame 101 is provided with a shaft 102 and a standard screw thread 103. With the thread, the light source can be twisted into a traditional light socket to replace prior art incandescent bulbs. Faces or facets 104 are provided on the lead frame 101. The lead frame 101 itself acts as cathode for the LED 100. A cap 105 of the anode is provided with an extended pin 106. The cathode and anode are isolated by an insulation layer 107. The LED chip(s) 108 are placed on each facet of the lead frame 101. One or more chips per facet or face can be used. A wire 109 connects the anode of the chip 108 to the anode 105 of the lead frame and wire 110 connects the cathode of the chip to the main body of the lead frame. The lead frame with chips is covered by an epoxy cap 120. The epoxy cap 120 acts as optical lens for light emitted from chip and also as protection layer for the chip and lead frame. The overall design achieves the following features for a light source: emission of light in an arc of 360 degrees; the light source is easily replaceable, and the light source is completely sealed and water proof.

Figure 2:
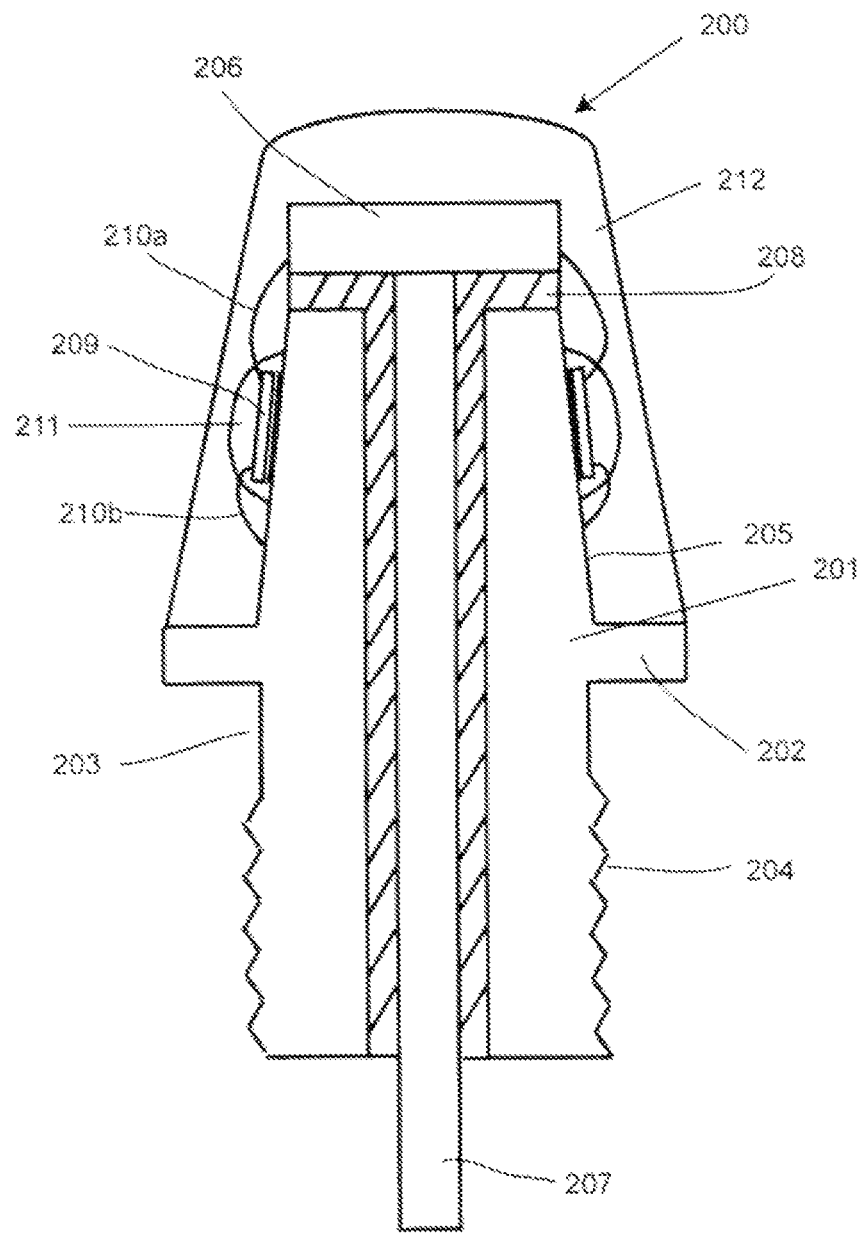
FIG. 2 depicts a cross-sectional view of the device of FIG. 1.
Figure 3:
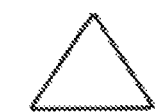
FIG. 3 depicts some example shapes for lead frame.
Figure 3:
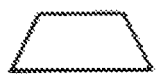
Figure 3:
Figure 3:
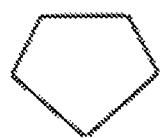
Figure 3:
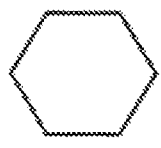
Figure 3:
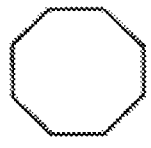

FIG. 2 depicts cross section 200 of the LED described in FIG. 1. Lead frame 201 is shown in cross section. Base 202 is the cathode of the LED, and the shaft 203 of the cathode connects to a threaded fitting 204. The facet portion 205 of the cathode is almost perpendicular to the base 202 in this example. Based on design requirements, the facet may not be perpendicular to the base. Cap 206 of the anode of the lead frame has a pin 207 extending through cathode of lead frame. The anode and cathode are isolated by an insulation material 208. The insulation material can be epoxy, A10, and any other materials having insulation properties. The insulation layer will electrically insulate the anode and cathode. Chips such as 209 are attached to facets of the lead frame. Chip 209 is connected to anode 206 using wire 210a and is connected to cathode 201 using gold or Al wire 210b. There is a light conversion layer 211 coated on top of chip 209 to convert the emitted from the chip into different color when such conversion is required. The lead frame, anode, cathode and chips are covered by an epoxy cap 212. The epoxy cap 212 acts as both optical lens and also as a protection layer for lead frame and chips.

Figure 4:
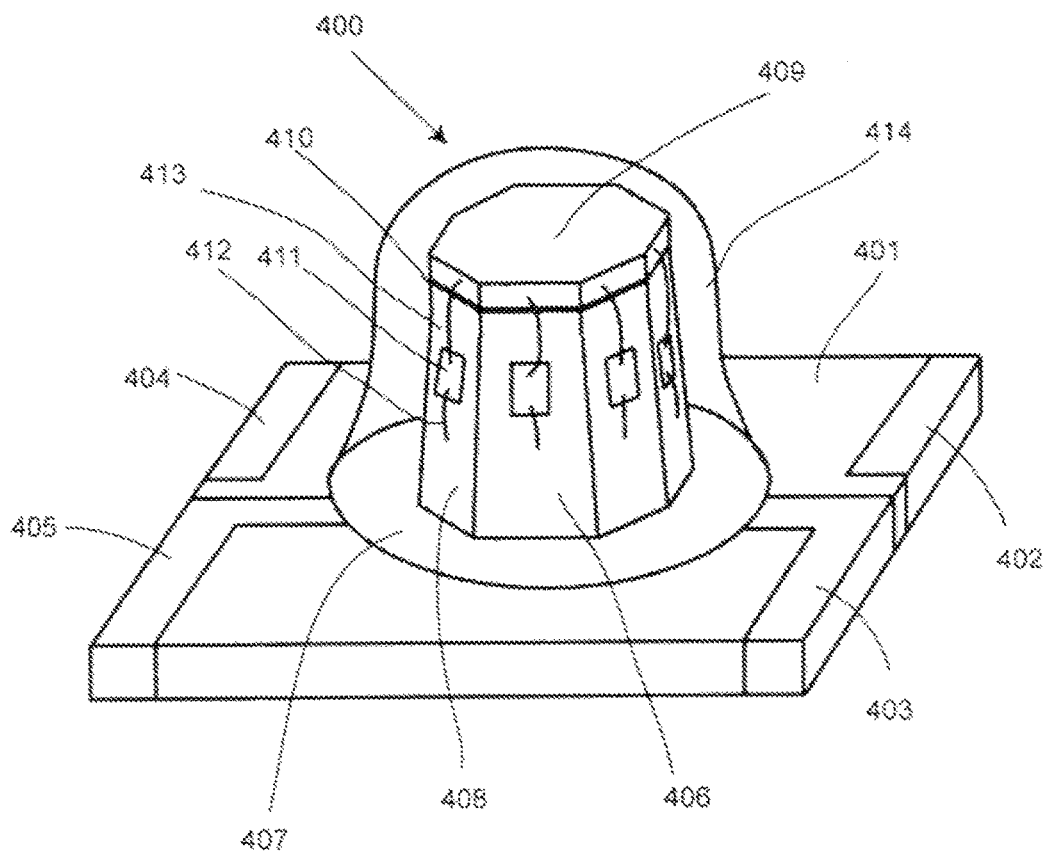
FIG. 4 depicts a perspective view of an alternative light source using a 3-dimensional multiple-faced lead frame.

FIGS. 3a-3f depict example profiles for a lead frame. The main shape of the lead frame is defined by the shape of cathode. The anode has the same shape as cathode and both can be any shape as desired. FIG. 4 depicts a multiple facet LED with a surface mount type package 400. A base 401 is provided that acts as a heat conductor. It can be made from electrically insulating material, such as ceramics, plastics, etc. On the base 401, electrodes 402 and 403 are laid on one side of the base and electrodes 404 and 405 are laid on the other side the base. Anodes 402 and 404 are also provided to complete the circuit with cathodes 403 and 405. Electrodes may be made by coating a metal layer like Al or Au or other alloys on top of a ceramic base. On top of the 401 base, there sits a cathode 407 of lead frame 406. The cathode 407 of lead frame 406 is connected to base 401. There are multiple vertical facets 408 connected to base 407. The anode cap 409 is placed on top of the cathode lead frame with an insulation layer 410 in between. A chip 411 is laid on one of the facets. The chip 411 is connected to cathode and anode through wires 412 and 413. The lead frame and chips are capped with epoxy layer 414, which will serve as a cap and also as an optical lens. Options include a surface mount type as well as a printed circuit board with various electronics.

Figure 5:
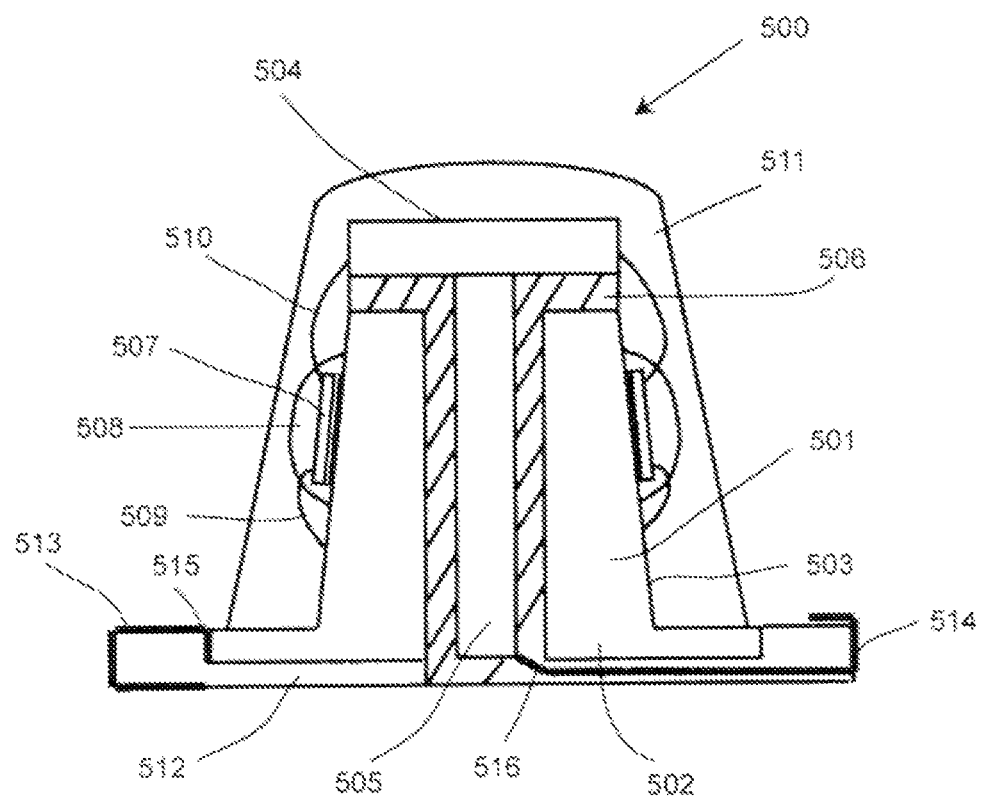
FIG. 5 depicts a cross-sectional view of the device of FIG. 4.

FIG. 5 depicts a cross-sectional view of an LED 500 such as that already discussed with respect to FIG. 4. A lead frame cathode 501 is provided with a base 502. A cap 504 is provided as well as an anode pin 505. An insulation layer 506 is located between the cathode and anode. An LED chip 507 is located on one of the frame faces such as 503. An optional phosphor coating layer 508 may be used for light color conversion. Wires 509 and 510 connect the chip to anode and cathode. An epoxy cap 511 covers the whole lead frame. The base profile of the LED is shown at 512. The material for base 512 has a property for heat conduction and electrical insulation. Electrodes are laid using metal coating layers 513 and 514 for cathode and anode, respectively. The cathode 503 of the lead frame is connected to cathode 513 in the base through connection 515 and anode 505 of the lead frame is connected to anode in the base 514 through connection 516.

Figure 6:
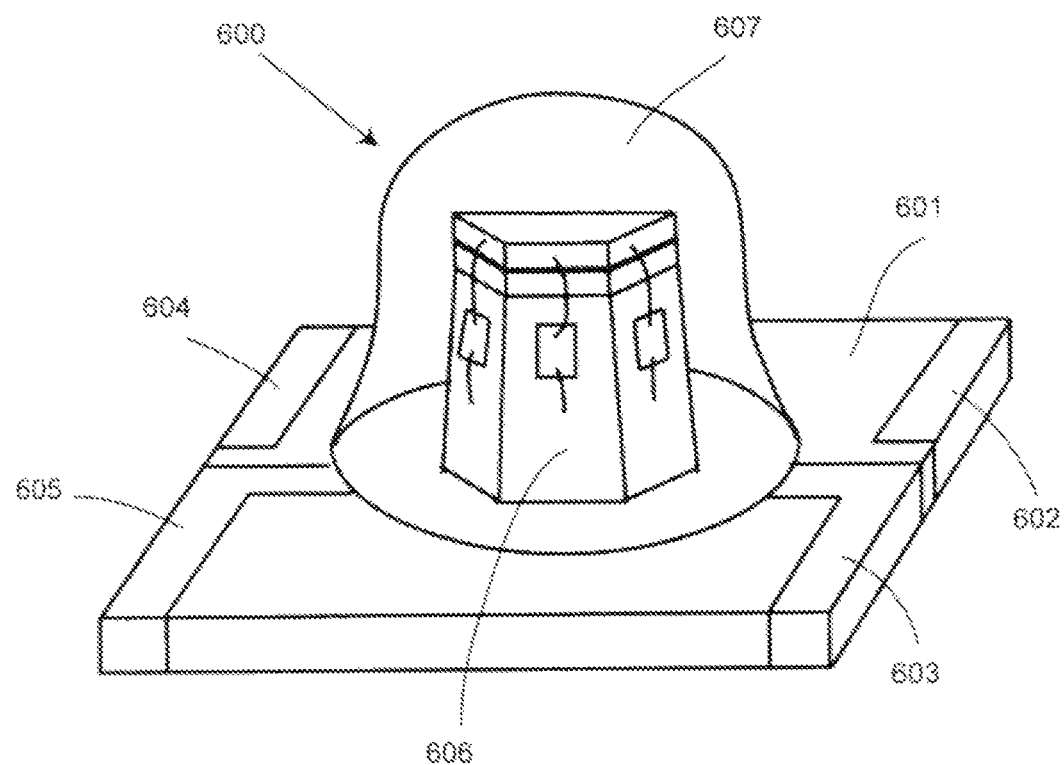
FIG. 6 depicts a perspective view of another alternative light source using a 3-dimensional multiple-faced lead frame.

FIG. 6 depicts another packaging style with light only emitted in one direction. Note the fewer faces on the frame. The LED 600 has a base 601 and electrodes 602, 603, 604, and 605 respectively. The lead frame 606 only has multiple facets in one direction and chips are placed on the facet. There is an epoxy cap 607 to protect the lead frame and LED chips. The light will be emitted in one direction. Such light can be used for different backlighting applications.

Figure 7:
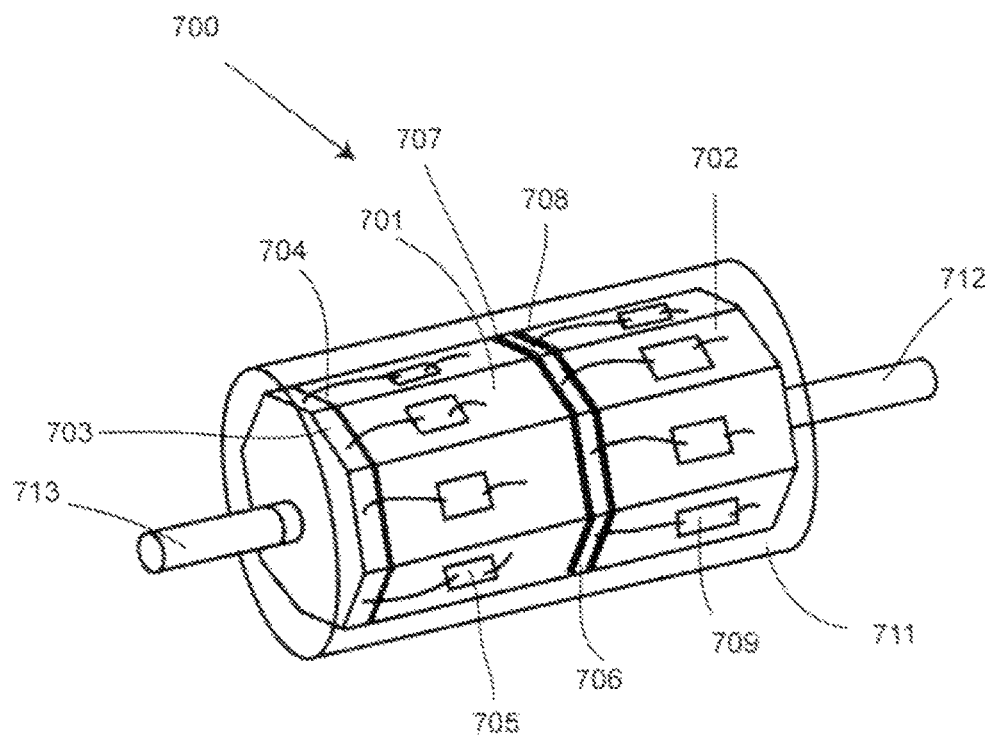
FIG. 7 depicts a perspective view of another alternative light source using a 3-dimensional multiple-faced lead frame.

FIG. 7 depicts a cylinder style of two multiple face lead frames connected to each other. LED 700 has two cathode lead frames 701 and 702 with multiple facets. One anode 703 is placed to next to cathode 701 with insulation layer 704. A chip 705 is placed on one of facets with wire connections to anode and cathode. Another anode 706 which is sandwiched by two insulation layers 708 and 709 is placed between frames 701 and 702. LED chip 709 is placed on top of one of faces in 702. An epoxy cap 711 is molded to cover the whole lead frame and components. Electrodes 712 and 713 are set up as the leads for anode and cathode, respectively.

Figure 8:
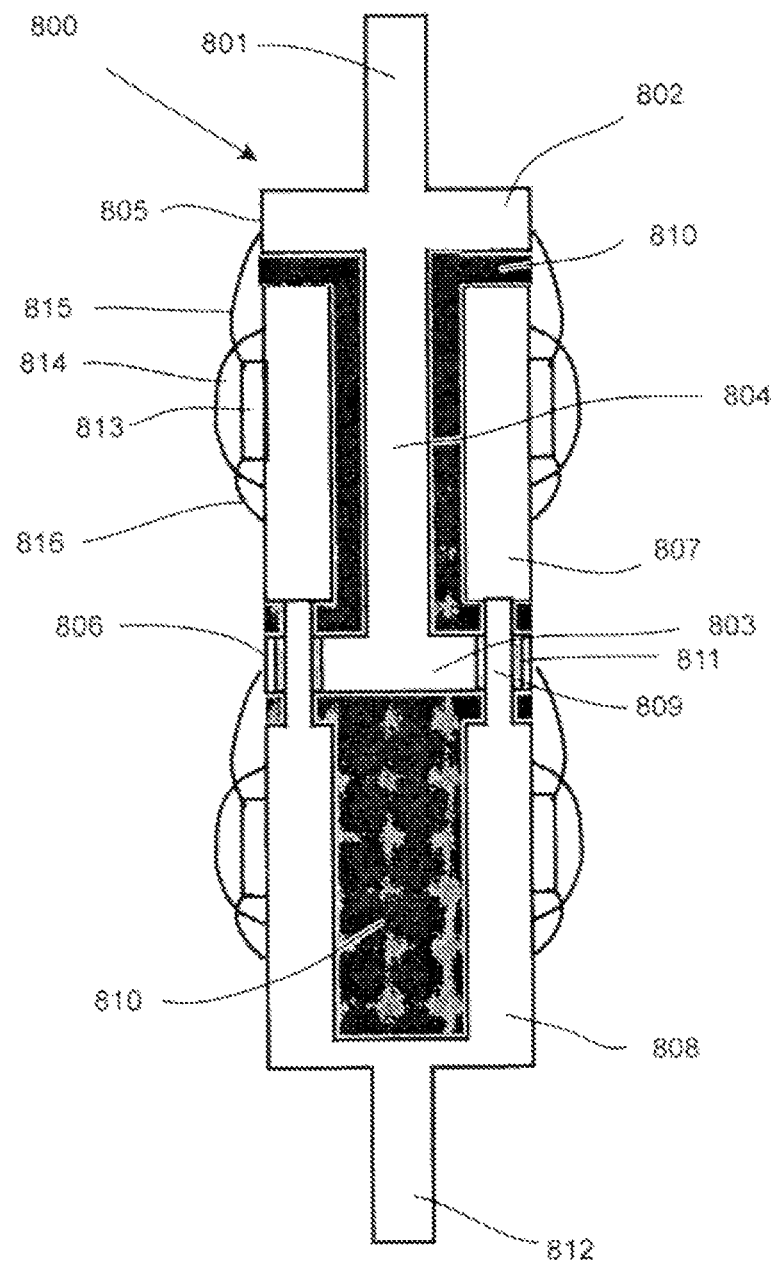
FIG. 8 depicts a cross-sectional view of the device of FIG. 7.

FIG. 8 depicts a cross sectional view of the LED illustrated in FIG. 7. This view shows the arrangement between anode and cathode. In the anode, there is a contact 801. Platforms 802 and 803 connected by a rod 804. There are two bonding facets 805 and 806 on platforms 802 and 803, respectively. Two cathodes 807 and 808 with multiple facets are connected through connection rod 809. Insulation layers 810 and 811 are used to fill the space between anode and cathode. The contact for cathode is 812. A chip 813 is mounted on a facet of the lead frame. An optional phosphor coating 814 can provide wavelength conversion. Wires 815 and 816 connect the chip to anode and cathode.

A light source with a multiple faceted lead frame with LED chip(s) attached to each facet can be provided to integrate multiple chip(s) into one small foot print package. The number of facets on the lead frame can be one to infinity depending on requirements. The lead frame is a 3-dimensional device with facets angled in desired directions. Cathode and anode of the lead frame isolated with insulation materials. One or more LED chips can be attached to each facet. A light conversion layer may be coated on top of LED chips to convert the color of the light emitted by the chips. The lead frame is covered by an epoxy capsule as both protection and optical lens. The lead frame can be a diode type with a thread on the base or surface mount type with electrodes on the base. The multiple faceted lead frame can be one section or multiple sections to form a bar type of light source. A white light source with multiple facet lead frame by applying a phosphor on top of a blue chip. The lead frame is made from a heat conducting material in order to draw heat away from the chips and avoid loss of lumen output due to heat effect.

While the present invention has been described and illustrated in conjunction with a number of specific embodiments, those skilled in the art will appreciate that variations and modifications may be made without departing from the principles of the invention as herein illustrated, described, and claimed. The present invention may be embodied in other specific forms without departing from its spirit or essential characteristics. The described embodiments are to be considered in all respects as only illustrative, and not restrictive. All changes which come within the meaning and range of equivalency of the claims are to be embraced within their scope.

What is claimed is:

1. A lighting device comprising:
   a body;
   a first LED chip disposed on the body;
   a second LED chip disposed on the body; and
   an electrode having a first part disposed above the first LED chip and the second LED chip, and a second part downwardly extending from the first part to an elevation lower than the first LED chip and the second LED chip.

2. The lighting device of claim 1, wherein the first LED chip and the second LED chip are electrically connected with each other in parallel.

3. The lighting device of claim 1, wherein the first LED chip or the second LED chip is electrically connected to the first part by a wire.

4. The lighting device of claim 1, wherein the second part is arranged between the first LED chip and the second LED chip.

5. The lighting device of claim 1, further comprising a light covering layer coated on the first LED chip, the second LED chip or both.

6. The lighting device of claim 1, further comprising a cap covering the first LED chip and the second LED chip.

7. The lighting device of claim 1, further comprising a screw thread coupled to the body.

8. The lighting device of claim 1, further comprising a base connected to the body.

9. The lighting device of claim 8, wherein the base has a top surface and a bottom surface, and the second part of the electrode extends to an elevation lower than the top surface.

10. The lighting device of claim 8, wherein the base has a top surface and a bottom surface, and the second part of the electrode extends to an elevation higher than the bottom surface.

11. The lighting device of claim 1, wherein the body is made of a heat conducting material.

12. The lighting device of claim 1, further comprising an optic lens covering the body, the first LED chip and the second LED chip.

\* \* \* \* \*